United States Patent
Oh et al.

(10) Patent No.: US 9,812,515 B2
(45) Date of Patent: Nov. 7, 2017

(54) ORGANIC LIGHT EMITTING DIODE DISPLAY

(71) Applicant: Samsung Display Co., Ltd., Yongin-si, Gyeonggi-do (KR)

(72) Inventors: Eon Seok Oh, Seoul (KR); Sang Yeol Kim, Hwaseong-si (KR); Min Seong Yi, Hwaseong-si (KR); Bo Mi Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/981,805

(22) Filed: Dec. 28, 2015

(65) Prior Publication Data
US 2016/0204169 A1    Jul. 14, 2016

(30) Foreign Application Priority Data
Jan. 9, 2015    (KR) .......................... 10-2015-0003500

(51) Int. Cl.
*H01L 51/52*    (2006.01)
*H01L 27/32*    (2006.01)

(52) U.S. Cl.
CPC ........ *H01L 27/3232* (2013.01); *H01L 27/326* (2013.01); *H01L 51/524* (2013.01); *H01L 51/5253* (2013.01)

(58) Field of Classification Search
CPC ............ H01L 27/3262; H01L 27/1229; H01L 51/524; H01L 51/5253; H01L 51/5203; H01L 27/326; H01L 27/3232; H01L 2227/326

See application file for complete search history.

(56) References Cited

U.S. PATENT DOCUMENTS

2014/0185129 A1* 7/2014 Kim ................. H01L 51/5284
                                                   359/296
2015/0279918 A1* 10/2015 Teraguchi .......... H01L 27/3276
                                                    257/40

FOREIGN PATENT DOCUMENTS

| JP | 10-208884 A | 8/1998 | |
| KR | 10-2009-0100920 A | 9/2009 | |
| KR | 10-2011-0071698 A | 6/2011 | |
| KR | 2013-0137946 A | * 12/2013 | ............. G02B 27/26 |
| KR | 10-2014-0063174 A | 5/2014 | |

OTHER PUBLICATIONS

Translation of KR2013-0137946 A (Kim et al) (Dec. 18, 2013) 15 pages.*

* cited by examiner

*Primary Examiner* — Caridad Everhart
(74) *Attorney, Agent, or Firm* — Lewis Roca Rothgerber Christie LLP

(57) ABSTRACT

An organic light emitting diode display includes a substrate including a light transmitting area which is at a display area for displaying an image, and an emission area which is adjacent the light transmitting area, an organic light emitting diode on the substrate at a location corresponding to the emission area; and a light control unit on the substrate at a location corresponding to the light transmitting area and configured to control transmission of light.

10 Claims, 6 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0003500 filed in the Korean Intellectual Property Office on Jan. 9, 2015, the entire contents of which are incorporated herein by reference.

BACKGROUND

1. Field

The present invention relates to an organic light emitting diode display, and more particularly, to a transparent organic light emitting diode display.

2. Description of the Related Art

Generally, as a representative example of flat panel displays, there are an organic light emitting diode display, a liquid crystal display, a plasma display panel, and the like.

Among those, the organic light emitting diode display includes organic light emitting diodes for displaying an image.

The organic light emitting diode display, which further includes a light transmitting unit which is adjacent to the organic light emitting diodes to transparently visualize an image through the light transmitting unit, has been developed.

The above information disclosed in this Background section is only for enhancement of understanding of the background of the invention and therefore it may contain information that does not form prior art.

SUMMARY

The present invention has been made in an effort to provide an organic light emitting diode display having a feature of selectively transmitting light.

An exemplary embodiment of the present invention provides an organic light emitting diode display, including: a substrate including a light transmitting area which is at a display area for displaying an image, and an emission area which is adjacent the light transmitting area; an organic light emitting diode on the substrate at a location corresponding to the emission area; and a light control unit on the substrate at a location corresponding to the light transmitting area and configured to control transmission of light.

The organic light emitting diode display may further include a thin film transistor between the substrate and the organic light emitting diode at a location corresponding to the emission area, the thin film transistor being connected to the organic light emitting diode.

The organic light emitting diode may include: a first electrode connected to the thin film transistor; an organic emission layer on the first electrode; and a second electrode on the organic emission layer.

The organic light emitting diode display may further include: a passivation layer covering the organic light emitting diode, wherein the light control unit is on the passivation layer.

The light control unit may include: a liquid crystal layer on the passivation layer; and a transparent electrode adjacent the liquid crystal layer and configured to tilt a liquid crystal of the liquid crystal layer.

The liquid crystal layer overlaps the emission area and the light transmitting area.

The transparent electrode may include: a first sub-electrode between the passivation layer and the liquid crystal layer; and a second sub-electrode on the liquid crystal layer.

The organic light emitting diode display may further include: an encapsulation substrate on the second sub-electrode, wherein the second sub-electrode is on the encapsulation substrate.

The transparent electrode may include a third sub-electrode and a fourth sub-electrode, which are spaced from each other on the liquid crystal layer.

The organic light emitting diode display may further include: an encapsulation substrate on the third sub-electrode and the fourth sub-electrode electrode, wherein the third sub-electrode and the fourth sub-electrode are on the encapsulation substrate.

The transparent electrode may include a fifth sub-electrode and a sixth sub-electrode, which are spaced from each other and are between the passivation layer and the liquid crystal layer.

According to an exemplary embodiment of the present invention, an organic light emitting diode display capable of selectively transmitting light is provided.

DETAILED DESCRIPTION

Figure 1:
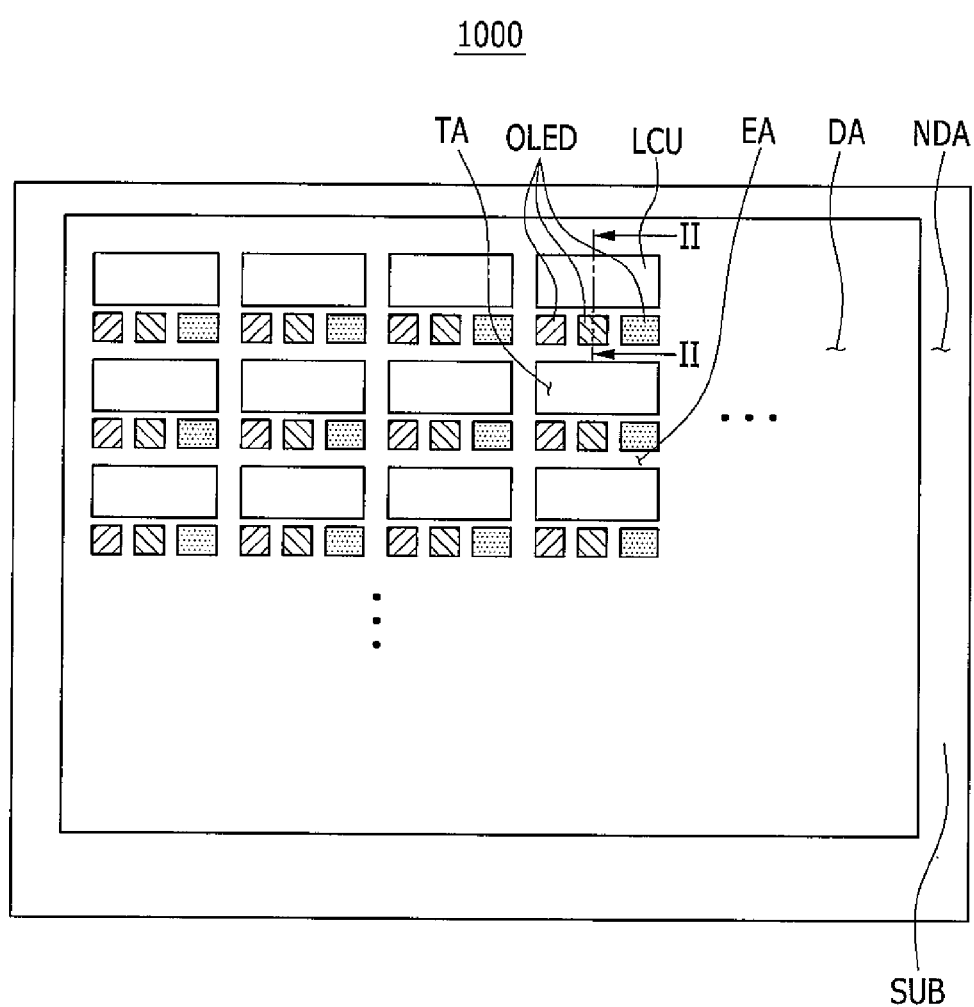
FIG. 1 is a plan view schematically illustrating an organic light emitting diode display according to an exemplary embodiment of the present invention.

In the following detailed description, several exemplary embodiments of the present invention have been shown and described by way of illustration. As those skilled in the art would realize, the described embodiments may be modified in various different ways, all without departing from the spirit or scope of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, an organic light emitting diode display according to an exemplary embodiment of the present invention will be described with reference to FIGS. 1 and 2.

FIG. 1 is a plan view schematically illustrating an organic light emitting diode display according to an exemplary embodiment of the present invention.

As illustrated in FIG. 1, an organic light emitting diode display 1000 according to an exemplary embodiment of the present invention is a transparent display device having a display area DA for displaying an image and a non-display area NDA adjacent to the display area DA and includes a light control unit LCU which controls transmission of light corresponding to a light transmitting area TA which is positioned in the display area DA, and an organic light emitting diode OLED which emits light corresponding to an emission area EA adjacent to the light transmitting area TA. The organic light emitting diode display 1000 is seen as a transparent display device by transmitting light through the light control unit (LCU).

Figure 2:
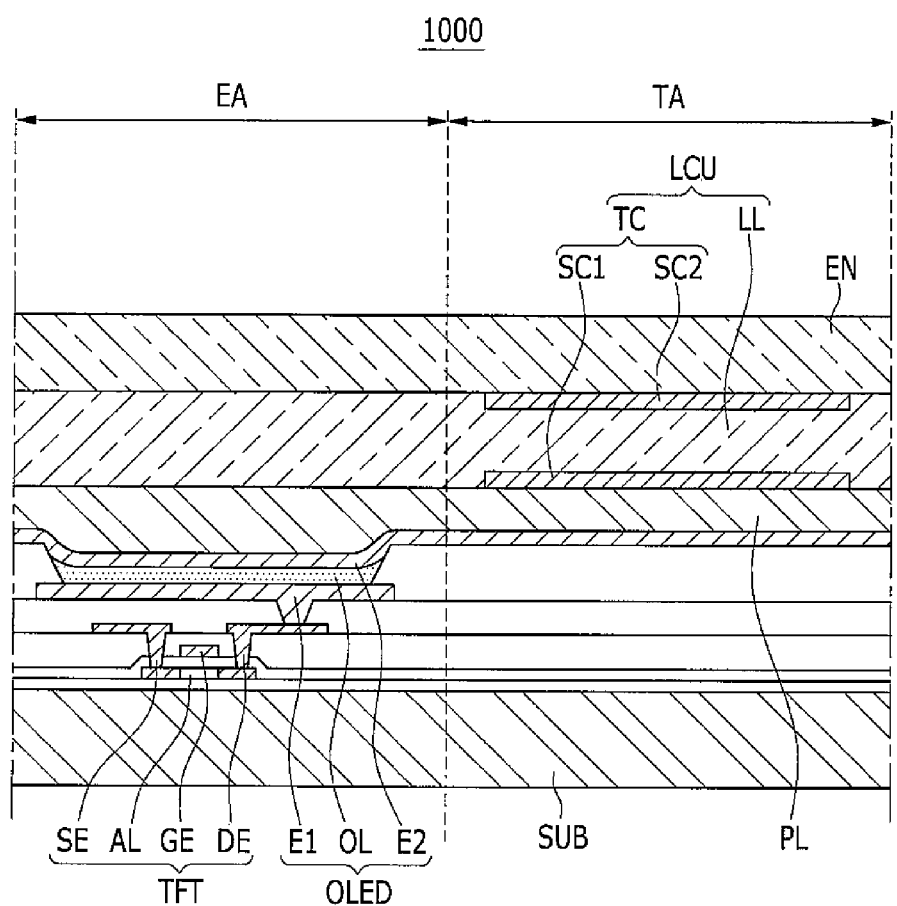
FIG. 2 is a cross-sectional view taken along the line II-II of FIG. 1.

FIG. 2 is a cross-sectional view taken along the line II-II of FIG. 1.

Referring to FIGS. 1 and 2, the organic light emitting diode display 1000 includes a substrate SUB, an organic light emitting diode OLED, a thin film transistor TFT, a passivation layer PL, the light control unit LCU, and an encapsulation substrate (EN).

The substrate SUB includes at least one of organic materials which include glass, quartz, ceramic, sapphire, and/or organic materials which may include one or more of polyethyleneterephthalate, polyimide, polycarbonate, epoxy, polyethylene, polyacrylate, and/or the like. The substrate SUB may be formed in a film form. In this case, the organic light emitting diode display 1000 may have flexible characteristics and may have stretchable or rollable characteristics. In some embodiments, the substrate SUB may also be made as a metallic substrate made of stainless steel, and/or the like.

The substrate SUB includes the light transmitting area TA and the emission area EA which are positioned corresponding to the display area DA.

The light transmitting area TA is positioned corresponding to the display area DA. The light transmitting area TA is provided in plural and the plurality of light transmitting areas TAs are each spaced apart from each other. The plurality of light transmitting areas TAs are arranged over the whole substrate SUB in a matrix form. In some embodiments, the plurality of light transmitting areas TAs may each be arranged in a non-formalized (e.g., non-matrix) network form. The organic light emitting diode display 1000 may be visualized as a transparent display device by transmitting fight through the light transmitting area TA.

The emission area EA is adjacent to the light transmitting area TA and is positioned between the light transmitting areas TAs which are adjacent to each other. The organic fight emitting diode OLED is positioned on the emission area EA.

The organic light emitting diode OLED is positioned on the substrate SUB, corresponding to the emission area EA and may be formed corresponding to one pixel. Herein, the pixel refers to a minimum unit (or a smallest unit) which displays an image. The organic light emitting diode OLED includes a first electrode E1, an organic emission layer OL, and a second electrode E2.

The first electrode E1 is positioned on the substrate SUB and is connected to the thin film transistor TFT through a contact hole. The first electrode E1 may be at least any one of a light reflective electrode, a light transmitting electrode, and a light transflective electrode. The first electrode E1 may be formed as an anode electrode or a cathode electrode. The first electrode E1 may be formed corresponding to one pixel.

The organic emission layer OL is positioned on the first electrode E1. The organic emission layer OL may include a first organic layer which includes at least one of a hole injection layer (HIL), a hole transporting layer (HTL), an electron transporting layer (ETL), an electron injection layer (EIL), and the like, a main emission layer positioned on the first organic layer, and a second organic layer which is positioned on the main emission layer and includes at least one of the hole injection layer (HIL), the hole transporting layer (HTL), the electron transporting layer (ETL), the electron injection layer (EIL), and the like.

The organic emission layer OL may include a red organic emission layer which emits red light, a green organic emission layer which emits green light, and a blue organic emission layer which emits blue light, in which the red organic emission layer, the green organic emission layer, and the blue organic emission layer, are each formed in a red pixel, a green pixel, and a blue pixel, respectively, to implement a color image.

Further, the organic emission layer OL may implement the color image by stacking the red organic emission layer, the green organic emission layer, and the blue organic emission layer in all of the red pixel, the green pixel, and the blue pixel, respectfully, and forming a red color filter, a green color filter, and a blue color filter for each pixel. Here, as long as the color filter is arranged in a path of light which is emitted from the organic emission layer OL, the color filter may be arranged at any position, without limitation.

As another example, the color image may be implemented by forming a white organic emission layer which emits white light in all of the red pixel, the green pixel, and the blue pixel and forming the red color filter, the green color filter, and the blue color filter for each pixel. Therefore, when implementing the color image using the white organic emission layer and the color filters, there is no need to use a deposition mask for depositing the red organic emission layer, the green organic emission layer, and the blue organic emission layer on each pixel. Here, each pixel may be one of the red pixel, the green pixel, and the blue pixel. The white organic emission layer described in another example may be formed of a single organic emission layer and may be configured to emit white light by stacking the plurality of organic emission layers. For example, the white organic emission layer may also include a configuration to emit white light by combining at least one yellow organic emission layer with at least one blue organic emission layer, a configuration to emit white light by combining at least one cyan organic emission layer with at least one red organic emission layer, and a configuration to emit white light by combining at least one magenta organic emission layer with at least one green organic emission layer, and the like.

The second electrode E2 is positioned on the organic emission layer OL. The second electrode E2 may include at least one of a light reflective electrode, a light transmitting electrode, and a light transflective electrode. The second electrode E2 may be formed as an anode electrode or a cathode electrode. The second electrode E2 is formed as a single plate and may be positioned over the plurality of pixels.

According to the exemplary embodiment of the present invention, the first electrode E1 may be formed as a light reflective electrode, the second electrode E2 may be formed as a light transmitting electrode or a light transflective electrode, such that the light emitted from the organic emission layer OL may be emitted in an encapsulation substrate EN direction.

The thin film transistor TFT is positioned between the substrate SUB and the organic light emitting diode OLED, corresponding to the emission area EA and is connected to the organic light emitting diode OLED. The thin film transistor TFT includes an active layer AL, a gate electrode GE, a source electrode SE, and a drain electrode DE.

The active layer AL is positioned on the substrate SUB, includes a source region, a channel region, and a drain region, and may be made of polysilicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (InGaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. The source region and the drain region of the active layer AL may each be doped with impurity, in which the impurity may be changed depending on a kind of thin film transistor and may be N-type impurity or P-type impurity.

The gate electrode GE is positioned on the active layer AL and corresponds to the channel region of the active layer AL.

The source electrode SE and the drain electrode DE are positioned on the active layer AL and the gate electrode GE and the source electrode SE and the drain electrode DE are each connected to the source region and the drain region of the active layer AL, respectively, through the contact hole.

According to exemplary embodiments of the present invention, the source electrode SE and the drain electrode DE are each positioned on a layer different from the active layer AL and are made of different materials but are not limited thereto. According to another exemplary embodiment of the present invention, the source electrode SE and the drain electrode DE are each positioned on the same layer as the active layer AL and may be made of the same material.

The thin film transistor TFT as described above may be included in the pixel circuit. Here, the pixel circuit may include a plurality of thin film transistors, at least one capacitor, a plurality of scan wirings, at least one data wiring, and the like, and may be formed in various structures within the scope in which those skilled in the art to which the embodiments of the present invention pertains are modified and practiced.

An insulating layer is positioned between the respective components which configure the thin film transistor TFT and the organic light emitting diode OLED, respectively, in which the insulating layer may be formed in a single layer or a plurality of layers which include at least one of the organic material and the inorganic material.

The passivation layer PL is positioned on the organic light emitting diode OLED connected to the thin film transistor TFT.

The passivation layer PL covers the organic light emitting diode OLED and protects the organic light emitting diode OLED from external interference. The passivation layer PL may include at least one of the organic material and the inorganic material, and may be formed in a single layer or a plurality of layers.

The light control unit (LCU) is positioned on the passivation layer PL.

The light control unit (LCU) is positioned on the substrate SUB, corresponding to the light transmitting area TA and controls transmission of light transmitted to the light transmitting area TA. The light control unit (LCU) is positioned on the passivation layer PL and includes a liquid crystal layer LL and a transparent electrode TC.

The liquid crystal layer LL is positioned on the passivation layer PL and an inside of the liquid crystal layer LL is provided with a plurality of liquid crystals which serves as a shutter. Here, the liquid crystal may have various characteristics. For example, the liquid crystal which is positioned inside the liquid crystal layer LL may be a nematic liquid crystal, a smectic liquid crystal, a cholesteric liquid crystal, and/or the like.

The liquid crystal of the liquid crystal layer LL is tilted by an electric field which is formed by the transparent electrode TC and the liquid crystal of the liquid crystal layer LL is tilted by the electric field formed by the transparent electrode TC to control the transmission of the light transmitted to the light transmitting area TA.

The liquid crystal layer LL overlaps the emission area EA and the light transmitting area TA of the substrate SUB. The liquid crystal layer LL is positioned on the passivation layer PL, such that the liquid crystal layer LL may protect the organic light emitting diode (OLED) from external interference, along with the passivation layer PL.

The transparent electrode TC is adjacent to the liquid crystal layer LL and forms an electric field to tilt the liquid crystal of the liquid crystal layer LL so as to control the transmission of light transmitted to the liquid crystal layer LL.

The transparent electrode TC includes a first sub-electrode SC1 and a second sub-electrode SC2.

The first sub-electrode SC1 is positioned between the passivation layer PL and the liquid crystal layer LL and the second sub-electrode SC2 is positioned on the liquid crystal layer LL. That is, the liquid crystal layer LL is positioned between the first sub-electrode SC1 and the second sub-electrode SC2 and a vertical electric field is formed between the first sub-electrode SC1 and the second sub-electrode SC2. Thus, the liquid crystal of the liquid crystal layer LL is tilted by the vertical electric field, thereby controlling the transmission of light transmitted to the light transmitting area TA.

The first sub-electrode SC1 and the second sub-electrode SC2 may each be patterned in various forms, if necessary. The first sub-electrode SC1 may be formed on the passivation layer PL and the second sub-electrode SC2 may be formed on the encapsulation substrate EN, but the exemplary embodiments of the present invention are not limited thereto. For example, as can be seen in FIG. 1, the second sub-electrode SC2 is between the encapsulation substrate EN and the liquid crystal layer LL. As long as the first sub-electrode SC1 and the second sub-electrode SC2 are able to apply the vertical electric field to the liquid crystal layer LL, the first sub-electrode SC1 and the second sub-electrode SC2 may be formed at any portion.

A power supply for forming a vertical electric field may be connected to at least one of the first sub-electrode SC1 and the second sub-electrode SC2, in which the power supply may be connected to the first sub-electrode SC1 and the second sub-electrode SC2 through wirings connected to the first sub-electrode SC1 and the second sub-electrode SC2, respectively. According to the exemplary embodiment of the present invention, for convenience of explanation, the power supply connected to the first sub-electrode SC1 and the second sub-electrode SC2, respectively, may be connected to the first sub-electrode SC1 and the second sub-electrode SC2, respectively, in various forms.

The encapsulation substrate EN is positioned on the light control unit LCU as described above.

The encapsulation substrate EN is positioned on the organic light emitting diode OLED and the light control unit LCU and covers the light control unit LCU and the organic light emitting diode OLED. The encapsulation substrate EN may be bonded to the substrate SUB by a sealant such as frit.

The surface of the encapsulation substrate EN may be provided with a black matrix, a color filter, a polarizer, a phase retardation plate, a touch sensor, and the like, in which the black matrix, the color filter, the polarizer, the phase retardation plate, the touch sensor, and the like may be formed in known various forms. The black matrix, the color filter, the polarizer, the phase retardation plate, the touch sensor, and the like may not overlap the light transmitting area TA, and the black matrix, the color filter, the polarizer, the phase retardation plate, the touch sensor, and the like do not overlap the light transmitting area TA such that the transmittance of the light transmitted to the light transmitting area TA is improved, thereby improving the transparency of the whole organic light emitting diode display 1000.

According to the exemplary embodiment of the present invention, the encapsulation substrate EN has a form of the substrate, but according to another exemplary embodiment of the present invention, the encapsulation substrate EN may have a thin film encapsulation form in which the plurality of organic layers and inorganic layers are selectively stacked.

As described above, the organic light emitting diode display 1000 according to the exemplary embodiment of the present invention includes the fight control unit LCU for controlling the transmission of light corresponding to the light transmitting area TA, thereby selectively controlling the transmittance of light transmitted to the organic light emitting diode display 1000.

For example, when the image displayed from the organic light emitting diode OLED is not easily seen due to strong external light, the light control unit LCU interrupts the light transmitted to the light transmitting area TA, thereby allowing to easily view the image displayed from the organic light emitting diode display OLED.

As another example, when the organic light emitting diode display 1000 is transparent as soon as the image is visualized from the fight emitting diode OLED, the light control unit LCU transmits the light transmitted to the light transmitting area TA, such that the outside may be easily visualized by the organic light emitting diode display 1000 as soon as the image is easily visualized from the organic light emitting diode (OLED).

That is, the organic light emitting diode display 1000, according to the exemplary embodiment of the present invention includes the light control unit LCU for controlling the transmission of light corresponding to the light transmitting area TA, and thus may serve as a transparent organic light emitting diode display or an opaque organic light emitting diode display.

Further, the organic light emitting diode display 1000 according to the exemplary embodiment of the present invention includes the passivation layer PL positioned between the organic light emitting diode OLED and the encapsulation substrate EN and the liquid crystal layer LL, such that the passivation layer PL and the liquid crystal layer LL overlap each other to protect the organic light emitting diode OLED from external interference, thereby suppressing the organic light emitting diode OLED from being damaged due to external interference. That is, there is provided the organic light emitting diode display 1000 in which the organic light emitting diode OLED is suppressed from being damaged from external interference.

Hereinafter, an organic light emitting diode display according to another exemplary embodiment of the present invention will be described with reference to FIGS. 3, 4A and 4B. Hereinafter, only components different from those of the organic light emitting diode display according to the exemplary embodiments of the present invention described above will be described.

Figure 3:
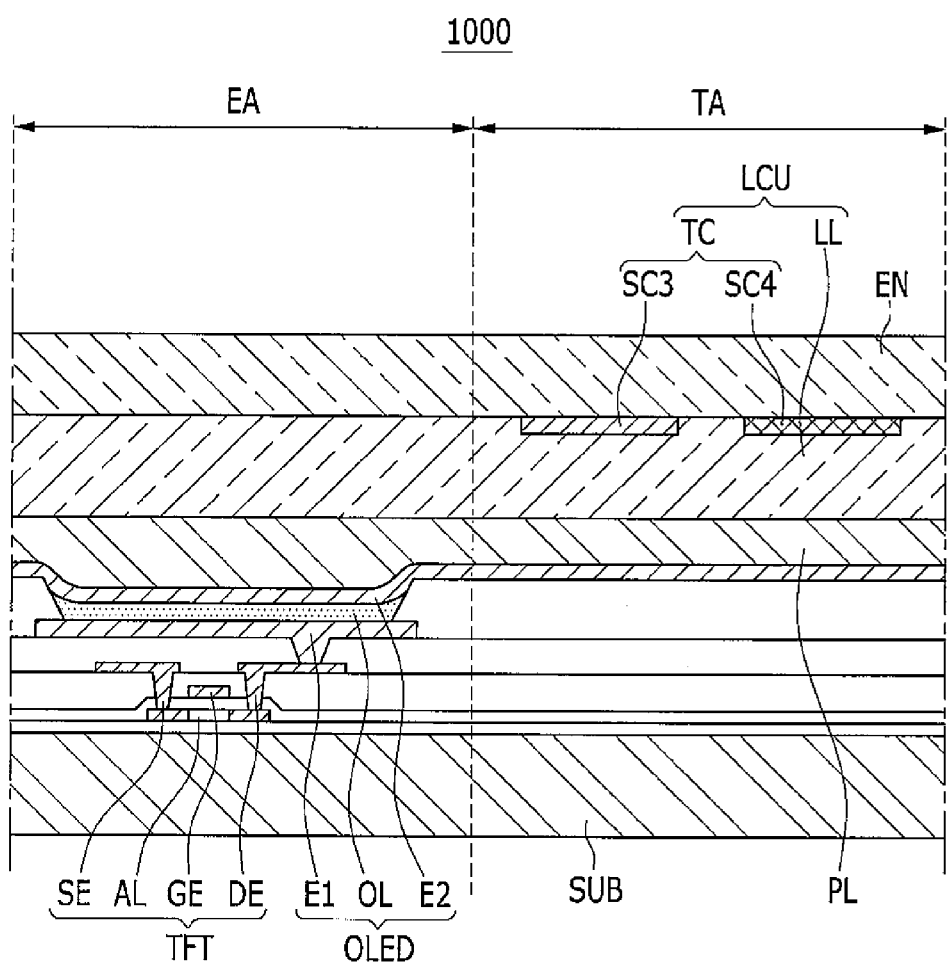
FIG. 3 is a cross-sectional view illustrating an organic light emitting diode display according to another exemplary embodiment of the present invention.

FIG. 3 is a cross-sectional view illustrating an organic light emitting diode display according to another exemplary embodiment of the present invention.

The light control unit LCU is positioned on the substrate SUB, corresponding to the light transmitting area TA and controls transmission of light transmitted to the light transmitting area TA. The light control unit LCU is positioned on the passivation layer PL and includes a liquid crystal layer LL and a transparent electrode TC.

The transparent electrode TC is adjacent to the liquid crystal layer LL and forms an electric field to tilt the liquid crystal of the liquid crystal layer LL so as to control the transmission of light transmitted to the liquid crystal layer LL.

The transparent electrode TC includes a third sub-electrode SC3 and a fourth sub-electrode SC4 which are spaced apart from each other on the liquid crystal layer LL.

The third sub-electrode SC3 is positioned between the liquid crystal layer LL and the encapsulation substrate EN and the fourth sub-electrode SC4 is positioned between the liquid crystal layer LL and the encapsulation substrate EN. That is, the third sub-electrode SC3 and the fourth sub-electrode SC4 are positioned on the liquid crystal layer LL and thus, are formed on the encapsulation substrate EN. A horizontal electric field is formed between the third sub-electrode SC3 and the fourth sub-electrode SC4, such that the liquid crystal of the liquid crystal layer LL is tilted by the horizontal electric field, thereby controlling the transmission of the light transmitted to the light transmitting area TA.

The third sub-electrode SC3 and the fourth sub-electrode SC4 may each be patterned in various forms, if necessary.

Figure 4A:
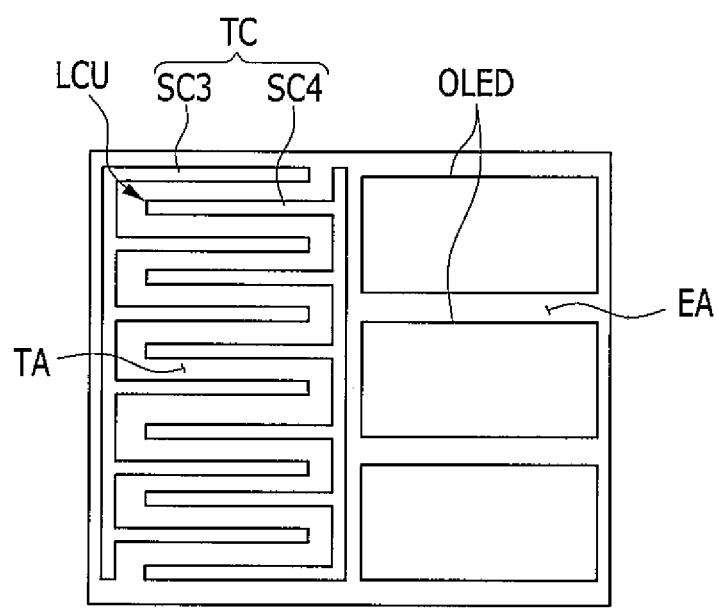
FIGS. 4A and 4B are plan views illustrating an example of a light transmitting area and an emission area illustrated in FIG. 3.
Figure 4B:
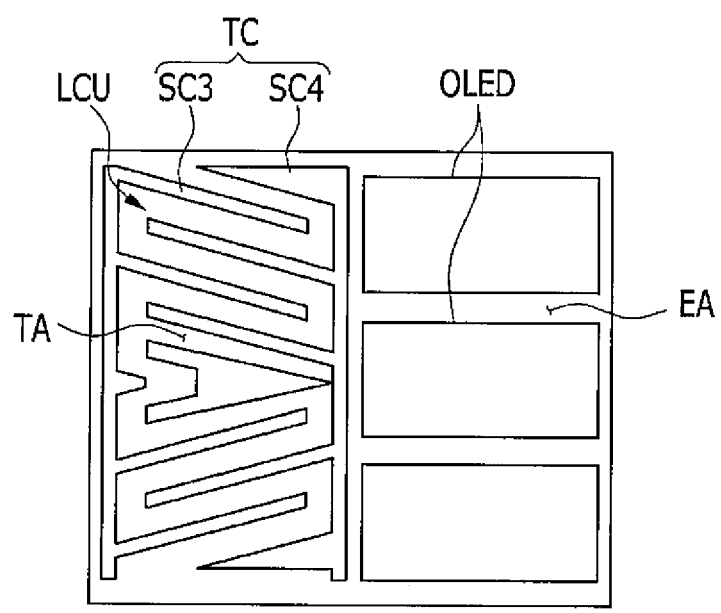

FIGS. 4A and 4B are plan views illustrating an example of a light transmitting area and an emission area illustrated in FIG. 3.

As illustrated in FIGS. 4A and 4B, the third sub-electrode SC3 and the fourth sub-electrode SC4, respectively, may be patterned in various forms to be adjacent to each other but are not limited thereto and may be variously patterned.

The third sub-electrode SC3 and the fourth sub-electrode SC4, respectively, may be formed in the encapsulation substrate EN but are not limited thereto. Therefore, as long as the third sub-electrode SC3 and the fourth sub-electrode SC4 are able to apply the horizontal electric field to the liquid crystal layer LL, the third sub-electrode SC3 and the fourth sub-electrode SC4 may be formed at any portion.

A power supply for forming a horizontal electric field may be connected to at least one of the third sub-electrode SC3 and the fourth sub-electrode SC4, in which the power supply may be connected to the third sub-electrode SC3 and the fourth sub-electrode SC4 through wirings connected to the third sub-electrode SC3 and the fourth sub-electrode SC4, respectively. According to another exemplary embodiment of the present invention, for convenience of explanation, the power supply connected to the third sub-electrode SC3 and the fourth sub-electrode SC4, respectively, may be connected to the third sub-electrode SC3 and the fourth sub-electrode SC4, respectively, in various forms.

As described above, the organic light emitting diode display 1000 according to another exemplary embodiment of the present invention includes the light control unit LCU controlling the transmission of light corresponding to the light transmitting area TA, thereby selectively controlling the transmittance of light transmitted to the organic light emitting diode display 1000.

That is, the organic light emitting diode display 1000 according to the exemplary embodiment of the present invention includes the light control unit LCU for controlling the transmission of light corresponding to the light transmitting area TA, and thus may serve as a transparent organic light emitting diode display or an opaque organic light emitting diode display.

Hereinafter, the organic light emitting diode display according to another exemplary embodiment of the present invention will be described with reference to FIG. 5. Hereinafter, only components different from those of the organic light emitting diode display according to the exemplary embodiment of the present invention described above will be described.

Figure 5:
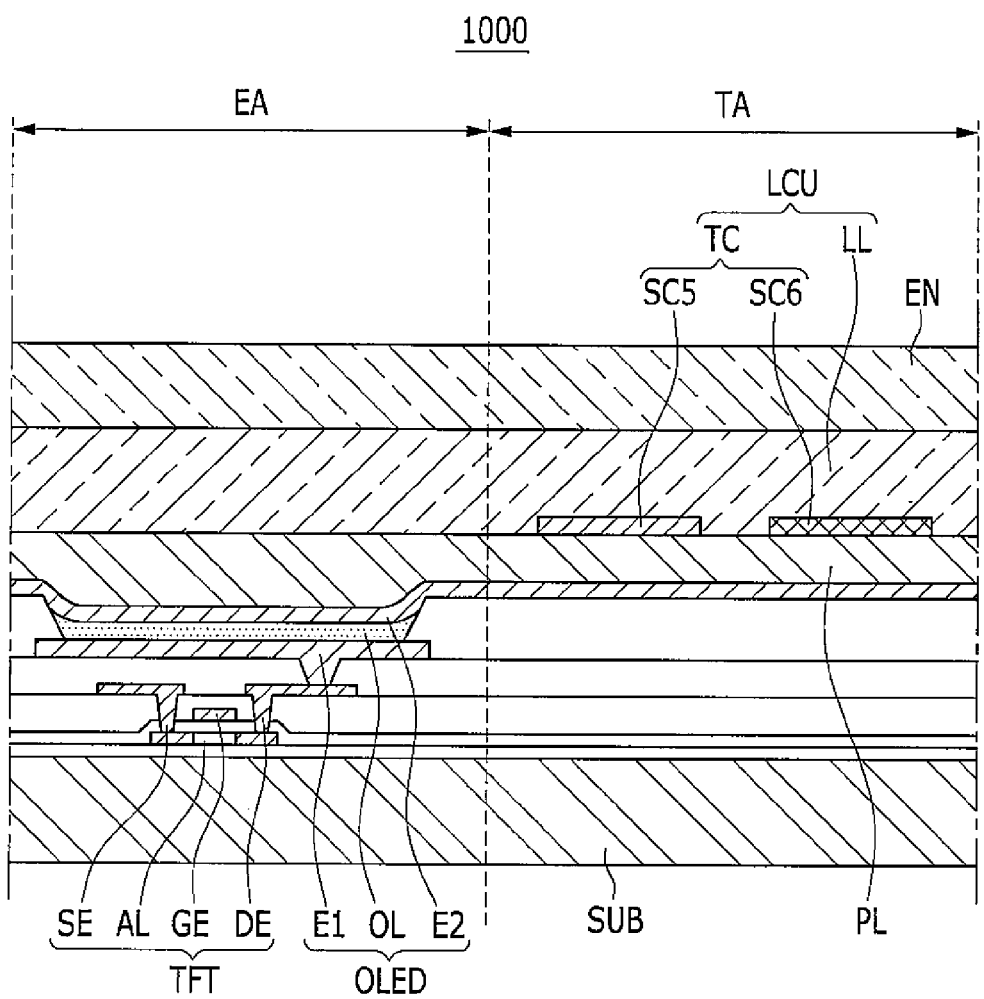
FIG. 5 is a cross-sectional view illustrating an organic light emitting diode display according to another exemplary embodiment of the present invention.

FIG. 5 is a cross-sectional view illustrating an organic light emitting diode display according to another exemplary embodiment of the present invention.

The light control unit LCU is positioned on the substrate SUB, corresponding to the light transmitting area TA and controls transmission of light transmitted to the light transmitting area TA. The light control unit LCU is positioned on the passivation layer PL and includes a liquid crystal layer LL and a transparent electrode TC.

The transparent electrode TC is adjacent to the liquid crystal layer LL and forms an electric field to tilt the liquid crystal of the liquid crystal layer LL so as to control the transmission of light transmitted to the liquid crystal layer LL.

The transparent electrode TC includes a fifth sub-electrode SC5 and a sixth sub-electrode SC6 which are spaced apart from each other between the passivation layer PL and the liquid crystal layer LL.

The fifth sub-electrode SC5 is positioned between the liquid crystal layer LL and the passivation layer PL and the sixth sub-electrode SC6 is also positioned between the liquid crystal layer LL and the passivation layer PL. That is, the fifth sub-electrode SC5 and the sixth sub-electrode SC6 are positioned between the liquid crystal layer LL and the passivation layer PL and thus, are formed on the passivation layer PL. A horizontal electric field is formed between the fifth sub-electrode SC5 and the sixth sub-electrode SC6, such that the liquid crystal of the liquid crystal layer LL is tilted by the horizontal electric field, thereby controlling the transmission of the light transmitting the light transmitting area TA.

The fifth sub-electrode SC5 and the sixth sub-electrode SC6 may each be patterned in various forms, if necessary.

The fifth sub-electrode SC5 and the sixth sub-electrode SC6 may each be formed in the passivation layer PL but are not limited thereto, and therefore, as long as the fifth sub-electrode SC5 and the sixth sub-electrode SC6 are able to apply the horizontal electric field to the liquid crystal layer LL, the fifth sub-electrode SC5 and the sixth sub-electrode SC6 may be formed at any portion.

A power supply for forming a horizontal electric field may be connected to at least one of the fifth sub-electrode SC5 and the sixth sub-electrode SC6, in which the power supply may be connected to the fifth sub-electrode SC5 and the sixth sub-electrode SC6 through wirings connected to the fifth sub-electrode SC5 and the sixth sub-electrode SC6, respectively. According to another exemplary embodiment of the present invention, for convenience of explanation, the power supply connected to the fifth sub-electrode SC5 and the sixth sub-electrode SC6, respectively, may be connected to the fifth sub-electrode SC5 and the sixth sub-electrode SC6, respectively, in various forms.

As described above, the organic light emitting diode display 1000 according to another exemplary embodiment of the present invention includes the light control unit LCU controlling the transmission of light corresponding to the light transmitting area TA, thereby selectively controlling the transmittance of light transmitted to the organic light emitting diode display 1000.

That is, the organic light emitting diode display 1000 according to the exemplary embodiment of the present invention includes the light control unit LCU controlling the transmission of light corresponding to the light transmitting area TA, and thus may serve as a transparent organic light emitting diode display or an opaque organic light emitting diode display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims, and their equivalents.

What is claimed is:

1. An organic light emitting diode display comprising:
   a substrate comprising a light transmitting area which is at a display area for displaying an image, and an emission area which is adjacent the light transmitting area;
   an organic light emitting diode on the substrate at a location corresponding to the emission area;
   a passivation layer covering the organic light emitting diode; and
   a light control unit on the passivation layer and on the substrate at a location corresponding to the light transmitting area and configured to control transmission of light.

2. The organic light emitting diode display of claim 1, further comprising:
   a thin film transistor between the substrate and the organic light emitting diode at a location corresponding to the emission area, the thin film transistor being connected to the organic light emitting diode.

3. The organic light emitting diode display of claim 2, wherein
   the organic light emitting diode comprises:
     a first electrode connected to the thin film transistor;
     an organic emission layer on the first electrode; and
     a second electrode on the organic emission layer.

4. An organic light emitting diode display comprising:
   a substrate having a light transmitting area at a display area for displaying an image, and an emission area adjacent the light transmitting area;
   an organic light emitting diode on the substrate at a location corresponding to the emission area;
   a passivation layer covering the organic light emitting diode,
   a light control unit on the passivation layer, on the substrate at a location corresponding to the light transmitting area, configured to control transmission of light, and comprising
     a liquid crystal layer on the passivation layer; and
     a transparent electrode adjacent the liquid crystal layer and configured to tilt a liquid crystal of the liquid crystal layer.

5. The organic light emitting diode display of claim 4, wherein
   the liquid crystal layer overlaps the emission area and the light transmitting area.

6. The organic light emitting diode display of claim 4, wherein the transparent electrode comprises a fifth sub-electrode and a sixth sub-electrode, which are spaced from each other and are between the passivation layer and the liquid crystal layer.

7. The organic light emitting diode display of claim 4, wherein
the transparent electrode comprises:
a first sub-electrode between the passivation layer and the liquid crystal layer; and
a second sub-electrode on the liquid crystal layer.

8. The organic light emitting diode display of claim 7, further comprising:
an encapsulation substrate on the second sub-electrode,
wherein the second sub-electrode is on the encapsulation substrate.

9. The organic light emitting diode display of claim 4, wherein
the transparent electrode comprises a third sub-electrode and a fourth sub-electrode, which are spaced from each other on the liquid crystal layer.

10. The organic light emitting diode display of claim 9, further comprising:
an encapsulation substrate on the third sub-electrode and the fourth sub-electrode,
wherein the third sub-electrode and the fourth sub-electrode are on the encapsulation substrate.

\* \* \* \* \*